US009570795B1

(12) United States Patent
Bruce et al.

(10) Patent No.: US 9,570,795 B1
(45) Date of Patent: Feb. 14, 2017

(54) MULTI-FUNCTIONAL SKIN INCORPORATING A PHOTO-VOLTAIC ARRAY AND A RF ANTENNA

(71) Applicant: Sunlight Photonics Inc., Edison, NJ (US)

(72) Inventors: Allan James Bruce, Scotch Plains, NJ (US); Sergey Frolov, Murray Hill, NJ (US); Michael Cyrus, Castle Road, CO (US)

(73) Assignee: SUNLIGHT PHOTONICS INC., Edison, NJ (US)

( * ) Notice: Subject to any disclaimer, the term of this patent is extended or adjusted under 35 U.S.C. 154(b) by 3 days.

(21) Appl. No.: 14/556,211

(22) Filed: Nov. 30, 2014

(51) Int. Cl.
*H01Q 1/28* (2006.01)
*H01Q 1/22* (2006.01)
*H02S 10/40* (2014.01)
*H01L 31/0216* (2014.01)

(52) U.S. Cl.
CPC .......... *H01Q 1/22* (2013.01); *H01L 31/02168* (2013.01); *H01Q 1/287* (2013.01); *H02S 10/40* (2014.12)

(58) Field of Classification Search
CPC ..................................................... H01Q 15/02
USPC ......................................................... 343/705
See application file for complete search history.

(56) References Cited

U.S. PATENT DOCUMENTS

| 6,395,971 | B1 | 5/2002 | Bendel et al. |
| 6,590,150 | B1 | 7/2003 | Kiefer |
| 6,958,729 | B1 | 10/2005 | Metz |
| 8,373,613 | B2 | 2/2013 | Lin et al. |
| 8,448,898 | B1 | 5/2013 | Frolov et al. |
| 8,897,770 | B1 | 11/2014 | Frolov et al. |
| 2002/0096599 | A1 | 7/2002 | McDermott |

(Continued)

FOREIGN PATENT DOCUMENTS

| EP | 1575124 A1 | 9/2005 |
| GB | 2082995 A | 3/1982 |
| JP | 2007012710 A | 1/2007 |

OTHER PUBLICATIONS

1. Bancroft R., Microstrip and Printed Antenna Design, Noble Publishing, 2004, 5 pages.

(Continued)

*Primary Examiner* — Dameon E Levi
*Assistant Examiner* — Andrea Lindgren Baltzell
(74) *Attorney, Agent, or Firm* — Stuart H. Mayer; Mayer & Williams PC

(57) ABSTRACT

A multi-functional, multi-layer film or skin which may be used as a covering for a structure or platform incorporates an integrated photovoltaic element and an integrated RF antenna element. The film or skin is suitable for use in various applications, including those involving autonomous, self-powered, mobile communication systems and especially for use as a skin or covering for solar powered aircraft and UAVs. Planar PV cells and planar RF antenna are used to facilitate their integration into the film or skin. The PV cells and RF antenna are configured to face operate outward from opposite faces of the skin. The film or skin addresses potential problems arising from conflicting directional requirements for PV orientation and antenna pointing on mobile platforms. This is accomplished by employing wide angle AR coatings on the PV elements and electrical controls to steer the RF antenna.

28 Claims, 3 Drawing Sheets

(56) References Cited

U.S. PATENT DOCUMENTS

| | | | |
|---|---|---|---|
| 2010/0008052 A1* | 1/2010 | Martin | H01Q 1/38 361/748 |
| 2011/0030757 A1 | 2/2011 | Lin et al. | |
| 2011/0287218 A1* | 11/2011 | Narimanov | G02B 1/002 428/141 |
| 2012/0287018 A1* | 11/2012 | Parsche | H01Q 1/243 343/897 |
| 2013/0009851 A1 | 1/2013 | Danesh | |
| 2013/0201063 A1 | 8/2013 | Mikami | |
| 2015/0122947 A1 | 5/2015 | Bruce et al. | |

OTHER PUBLICATIONS

2. Nallo et al., Multi-band internal antenna for mobile phones, Elect. Lett., 41, 514-5, 2005.
Author Unknown, Meta-material Surface Antenna Technology (MSAT), www.intelectualventures.com, 2011, 2 pages.
4. Barasara et al., Multi-frequency Fractal Antenna, Int. J. Sci.& Eng. Research, 3, 1-3, 2012.
5. Cravey et al., Structurally Integrated Antenna Concepts for HALE UAVs, NASA/TM-2006-214513, 23 pages.
6. Dreyer et al., Copper and Transparent-Conductor Reflectarray Elements on Thin-Film Solar Cell Panels, IEEE Transactions Antennas and Propagation, 62, 3813-3818, 2014.
7. Henze et al., Radio Interference of Photovoltaic Power Systems, Proc. 16th Intl. Wroclaw Symposium & Exposition on EMC, Wroclaw, Poland 2002.
Author Unknown, Reducing Electromagnetic Inteference in Photovoltaic Systems, www.solar-electric.com , 2014, 7 pages.
Vaccaro et al., "Integrated Solar Panel Antennas" Electronic Letters, Mar. 2, 2000, vol. 36, No. 5, pp. 390-391.
Tanaka et al. "Microstrip Antenna with Solar Cells for Microsatellites" Electronic Letters, vol. 31, No. 1, Jan. 5, 1995, pp. 5-6.
Oh et al., "Flexible Antenna Integrated with an Eptiaxial Lift-Off Solar Cell Array for Flapping-Wing Robots" IEEE Transactions on Antennas and Propagaton, vol. 62, No. 8, Aug. 1, 2014, pp. 4356-4361.

* cited by examiner

MULTI-FUNCTIONAL SKIN INCORPORATING A PHOTO-VOLTAIC ARRAY AND A RF ANTENNA

FIELD OF INVENTION

The present invention relates to the structure and functionality of a multi-functional, multi-layer, film or skin, with integrated photovoltaic (PV) cells and Radio Frequency (RF) antennas, which can also be independently directionally tuned. Target applications include mobile communications platforms.

BACKGROUND

Multi-functional articles, in which multiple structural and/or functional materials, or components, are integrated to achieve advantages of reduced volume, area, weight, power consumption & management, cost, enhanced performance, and more are of great technological interest in many fields.

Multifunctional articles may combine PV cells and RF antennas, for example. The fields of PV cells and RF antenna are extensively documented. Systems incorporating both PV cells and RF antenna have also been described. PV cells are typically comprised of a layer of semi-conductor absorber material, a p-n junction and electrical contact layers for extracting current for external use or electrical storage. Exemplary absorber materials include crystalline Si and thin film, amorphous Si, CdTe or Cu—In—Ga—Se (CIGS). Thin film cells have been fabricated on flexible metal foils and polymeric sheets, which enable lightweight and flexible modules. In operation, PV cells are typically oriented towards the sun. In some systems, PV modules are mounted on mechanical solar trackers to optimize power generation throughout the day or seasonally.

Numerous RF antenna designs, with wavelength specific resonant structures, have been implemented including, planar or low-profile antenna. Exemplary designs include patterned metallic, or conductive, micro-strip patch antenna and meta-material surface antennas. Phased array antenna (PAA) configurations have been used to enhance performance or to enable directional beam steering. Fractal designs have been used to enable multi-frequency operation. RF systems have also been integrated with other electrical systems including PV systems, although due attention should be paid to address potential interference and increased signal noise issues. Standard approaches for electrical isolation and grounding are typically employed to mitigate such issues. RF antenna designs have also been proposed for mobile applications including unmanned aircraft vehicles (UAVs) and mobile phones. However the proposed designs are non-planar or folded.

Systems in which PV cells and RF antennas are combined have been proposed for autonomous, self-powered communication and sensor devices. Typically the PV and RF systems in these applications are either (i) independently positioned on structures without significant integration or (ii) overlaid on top of each other. The latter configurations can have a top layer with a patterned antenna structure which frames a window to underlying PV cells or have an overlaid array of PV cells which are spaced to provide channels to underlying antenna. Each of these approaches gives rise to significant limitations. For instance, the relatively large size and weight of these PV and RF systems may be a significant hindrance for us in or on various types of platforms, especially on aircraft platforms. If the PV and RF systems are overlaid the performance of one system may be compromised by partial shading or shielding by the other. Furthermore PV and RF systems can have different operational directions. That is, PV systems are ideally oriented towards the sun for maximum power generation while RF antennas may need to be oriented towards remote transmitting or receiving systems in order to establish a strong communications link. These directionalities can be conflicting and the problem can be further exacerbated if the integrated system is located on a moving platform such as an individual or vehicle with a separately defined mission path. In the integrated planar approaches noted above, the PV and RF antenna functionalities typically operate through the same face of the article. Such mono-facial operation can be appropriate for terrestrial applications where system orientations for receiving solar illumination and RF communications are generally in upward and lateral directions but are inappropriate for elevated, airborne or space applications where the desired RF communications link orientation can be in the opposite direction to solar illumination.

SUMMARY

In accordance with a first aspect, the present disclosure describes a multi-functional, multi-layered skin which incorporates at least PV and RF antenna elements or layers. The integration is implemented to achieve benefits that may include reduced volume, area, weight, power consumption, cost, enhanced performance and/or reliability, where the skin is used as a covering for a platform or structure, including autonomously powered communication platforms.

In accordance with a second aspect a multi-functional, multi-layered film or skin is described in which the PV and RF antenna elements are configured to operate predominantly through opposing faces of the skin targeting applications where the directional priorities of the PV and RF antenna are dissimilar.

In accordance with a third aspect a multi-functional, multi-layered film or skin incorporates at least PV and RF antenna elements, which are suitable for use on mobile platforms where the operational path of the platform can conflict with the directional priorities of the PV and/or RF antenna.

In accordance with another aspect, a multi-functional structure is disclosed with includes a self-supporting, open frame and a multilayer skin or film that includes at least first and second layers. The multilayer skin or film extends over and is secured to the self-supporting, open frame. The first layer includes at least one photovoltaic (PV) cell. The first layer is disposed within the multilayer skin or film such that the first layer is exposable to electromagnetic radiation received by a first surface of the film or skin. The photovoltaic cell is configured to generate electrical power from the electromagnetic radiation. The second layer includes at least one RF antenna. The second layer is disposed within the multilayer skin or film such that the second layer is exposable to RF radiation received by a second surface of the film or skin. The first and second surfaces are opposing surfaces of the multilayer skin or film.

In accordance with another aspect, the multilayer skin or film further comprises at least one retaining, protective layer disposed over the first or second layer.

In accordance with another aspect, the multilayer skin or film further comprises at least one other retaining, protective layer disposed over the other of the first and second layers.

In accordance with another aspect, the photovoltaic cell includes one or more PV cell arrays.

In accordance with another aspect, the RF antenna includes one or more RF antenna arrays.

In accordance with another aspect, the multilayer skin or film further comprises at least one first electrical interconnection layer for electrically connecting RF antennas in the RF antenna array.

In accordance with another aspect, the first electrical interconnection layer includes a patterned backplane.

In accordance with another aspect, the first electrical interconnection layer also electrically connects PV cells in PV cell array.

In accordance with another aspect, the electrical interconnections to the RF antennas are electrically isolated from electrical interconnections to the PV cells.

In accordance with another aspect, the multilayer skin or film further comprises at least one second electrical interconnection layer for electrically connecting PV cells in the PV cell array.

In accordance with another aspect, the first and second electrical interconnection layers are electrically isolated from one another.

In accordance with another aspect, the PV cell includes a thin wafer of crystalline or polycrystalline silicon as a photovoltaic absorber material In accordance with another aspect, the PV cell includes one or more thin film photovoltaic absorber layers formed from a material selected from the group consisting of amorphous Silicon, Cadmium Telluride, Cu—In—Ga—Se and GaAs In accordance with another aspect, the one or PV cell arrays are disposed on a flexible substrate.

In accordance with another aspect, the flexible substrate is selected from the group consisting of a metallic foil or polymer material.

In accordance with another aspect, the RF antenna is a planar antenna.

In accordance with another aspect, the planar antenna is micro-strip antenna.

In accordance with another aspect, the RF antenna is a meta-material antenna.

In accordance with another aspect, the RF antenna has a fractal design.

In accordance with another aspect, the multilayer skin or film includes at least one anti-reflective layer for capturing the electromagnetic radiation to which the PV cell is exposed.

In accordance with another aspect, the anti-reflective layer is configured to transmit therethrough solar energy having optical wavelengths.

In accordance with another aspect, the anti-reflective film is configured to transmit therethrough electromagnetic radiation received at angles of incidence between 0-180 degrees.

In accordance with another aspect, the RF antenna array is an actively steerable antenna.

In accordance with another aspect, the actively steerable antenna is electrically steerable.

In accordance with another aspect, an electrical control circuit is used to steer the antenna.

In accordance with another aspect, the steerable antenna is employed to establish or maintain directional communications.

In accordance with another aspect, the PV cell array includes an anti-reflective layer and the antenna array is actively steerable such that directional operation of the PV cell array and the antenna array are independently tunable or optimizable.

In accordance with another aspect, an electrical interconnect is electrically coupled to the PV cell for providing electrical power to an external element.

In accordance with another aspect, an electrical interconnect is electrically coupled to the RF antenna for providing an electrical signal to an external element.

In accordance with another aspect, the self-supporting open frame is located on an external portion of a self-powered operationally mobile platform or device.

In accordance with another aspect, the self-supporting open frame constitutes at least a portion of an aircraft wing.

In accordance with another aspect, the aircraft wing is a UAV wing.

In accordance with another aspect, the portion of the aircraft wing is an upper surface of the aircraft wing.

In accordance with another aspect, the portion of the aircraft wing is a lower surface of the aircraft wing.

In accordance with another aspect, the PV cell operates over a range of wavelengths or wavelength bands.

In accordance with another aspect, the PV cell includes a plurality of PV cells operating at different wavelengths.

In accordance with another aspect, the PV cell includes a multi-junction PV cell.

In accordance with another aspect, the first layer includes at least one PV cell operational with electromagnetic energy other than solar energy.

In accordance with another aspect, the electromagnetic energy other than solar energy is electromagnetic energy from a remotely located laser.

In accordance with another aspect, the second layer includes a plurality of RF antennas operational at different frequencies.

In accordance with another aspect, the second layer includes an antenna configured to receive beamed microwave energy from a remote source and convert the microwave energy to electrical energy.

In accordance with another aspect, the first and second layers are located on a common surface of the multi-functional skin In accordance with another aspect, the multi-functional skin is a continuous element.

In accordance with another aspect, the multi-functional skin comprises a plurality of modular elements laterally disposed across the open-frame structure.

In accordance with another aspect, each of the plurality of modular elements have different compositions, structures or functionality.

In accordance with another aspect, at least one of the antennas is configured to operate at optical communication frequencies.

Embodiments of the present invention, some of which are summarized above and discussed in greater detail below, can be understood by reference to the illustrative embodiments of the invention depicted in the appended drawings. It is to be noted, however, that the appended drawings illustrate only some embodiments of the invention and are therefore not to be considered limiting of its scope, for the invention may admit to other equally effective embodiments.

DETAILED DESCRIPTION

Figure 1:
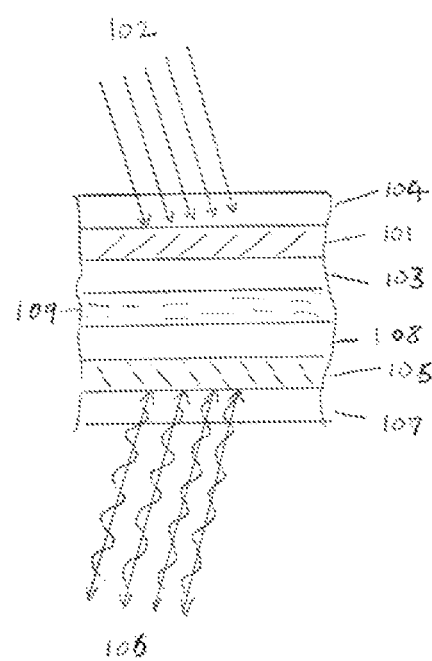
FIG. 1 shows a schematic cross-section of a bi-facially operating, multi-layered, multi-functional skin incorporating PV array and RF antenna array layers.

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

The present disclosure describes a multi-functional, multi-layered article which is a film or skin, or a covering for a frame or structure, with integrated structural and functional, or multi-functional, roles. Such a film or skin may include a single or multiple layers, each of which may be structurally or compositionally homogeneous or composite in nature. Specific functionality may be located in a single layer, or distributed over a number of layers. Different functions may be located in the same layers, different layers, or share common layers. The functionality may also be located in the same, distinct or overlapping areas of the skin. The functional and support layers form part of the multi-functional skin, with the option of having common support, or shared functional layers.

As used herein, the term "layer" is used to refer to each of the one or more compositions, or structures, the same or different, that are secured to one another in thin sheet or film-form by any appropriate means such as by an inherent tendency of the materials to adhere to one another, or by inducing the compositions to adhere as by a heating, radiative, chemical, or some other appropriate process. The term "layer" is not limited to detectable, discrete compositions contacting one another such that a distinct boundary exists between the compositions. Preferably however, the components used to make one layer of a film will be different (i.e., the weight percent of components, the structure or the properties of each component, and/or the identity of the components may differ) from the composition used to make an adjacent layer, when present. The term "layer" includes a finished product having a continuum of compositions throughout its thickness. The "films" or "skins" described herein comprise one or more layers, and may comprise two, three or more layers that are secured to one another to form single identifiable structure.

The layers of the film or skin may be joined in several ways which include; fusing of similar or dissimilar, but separate, materials layers (e.g. by thermal lamination), or by using adhesives. The skin may also be formed by the sequential deposition and/or structuring of material layers in a monolithic form. One such sequential deposition method that may be employed is 3D printing. Various patterning and etching processes may be also be employed.

Existing technologies may be employed, for the fabrication and integration of PV and RF antenna structures in a multi-functional skin. For instance, the functional elements may be fabricated separately as planar elements on flexible polymer substrates and then laminated or, they may be fabricated directly on a common substrate. The functional elements may be located in specific layers of the skin or they may be wholly or partially co-located in common layers (e.g. potential co-location of electrical circuitry for both the PV and RF components).

The present disclosure describes a multi-functional, multi-layer film or skin which incorporates at least an integrated photovoltaic element and an integrated RF antenna element. The use of PV and antenna elements that have planar structures facilitates their integration into a film or skin. The skin is designed to achieve advantages of integration which may include reduced size area, weight, power consumption or cost or enhanced performance and reliability. The invention has broad applicability, but is especially useful for applications involving autonomous, self-powered, mobile communication systems and specifically for use as a skin or covering for solar powered aircraft or unmanned aircraft vehicles (UAVs). There is great interest in UAV platforms to support a wide variety of applications in the areas of civil and defense aviation including, surveillance, communications and payload operation or delivery.

Solar powered UAVs are a subset of UAVs in which all, or a substantial fraction, of the power for flight, payload operation and energy storage for extending operations during night, or conditions of low solar irradiance, is supported by PV arrays deployed on the wings or other sites on the airframe. The current disclosure addresses a set of challenges which may be faced when designing a UAV platform which may simultaneously be required to achieve (i) low-powered flight for an extended duration mission, (ii) air to ground (ATG) or air-to-air (ATA) wireless communication links and (iii) PV solar collection for powering and battery charging. Each of these operational aspects will have a directional aspect which is unlikely to be fully consistent with the others. For instance a UAV may be required to fly along an operational path that prevents optimal or even adequate reception of electromagnetic radiation by a conventional PV element and/or optimal or even adequate reception of RF signals by a conventional RF antenna element.

One embodiment described herein addresses a situation in which UAV mission endurance is prioritized, and the flight power, which typically represents the most substantial energy usage, is actively minimized through remote, or autonomous, flight control which adjusts flight path and orientation within mission parameters. In this case the directionality of both the PV and antenna systems ideally should be passively or actively tunable to be able to adapt to the flight parameters. Physical or mechanical adjustment mechanisms are considered impractical. Alternatively, the electrical steering of RF antennas which is compatible with planar micro-strip and meta-material antenna designs, is a potential solution. For PV cells, a passive approach using an anti-reflection coating designed to accept and transmit light with wide incidence angles is preferred. This enables the maximum light to be harvested in a given flight path. Examples of suitable anti-reflection (AR) coating that may be used in some embodiments are shown in U.S. patent application Ser. No. 14/466,935 entitled "Flexible and Tunable Anti-Reflection Skin," which is hereby incorporated by reference in its entirety. Such anti-reflection coating may include, for example, index profiled AR coating, interference-based AR coatings, nano-structured or nano-particulate AR coatings, composite AR coatings, and combinations thereof.

In another exemplary embodiment, a film or skin with the PV and RF antenna elements oriented towards opposite faces of the film or skin, may be deployed on an aircraft wing having incident solar light on the upward facing PV element and air-to-ground (ATG) wireless communication enabled by the downward facing RF antenna. If the wing has an open-frame design with the film or skin extending over and secured to the open-frame, the film or skin functions as the surface of an entire wing section in a kite-like or sail-like configuration. However, if the skin is overlaid on a conventional closed-framed wing structure then the under or overlying wing structure should be suitably transparent to light or RF signals (see FIGS. 2 and 3, described below).

The specific design, composition and characteristics of the antenna employed in the multi-functional films or skins will depend on the specific communications application addressed. In many cases the antennas are planar directional antennas as opposed to vertical antennas or reflecting arrays. Resonant antenna structures (typically at ½ or ¼ wavelength of operation) will be determined by specific communication frequencies which conform to national or international communications standards for wireless and radio communications. Exemplary communication frequencies addressed may include wireless communication bands between 2-10 GHz or X-band communications between 8-12 GHz. The defined operating distance, or range, and the required transmit and receive functionality amongst other operational parameters will influence the preferred size and area of the antenna. For example for high altitude UAVs, the range for air-to-ground or air-to-air communications may be 20 km or more. In such a scenario, with the typical divergence of communications beams, large (>1 m) antenna or antenna arrays will be desirable for receiver operations. Indeed the antenna size may well be limited by the platform size. Independent position sensing (e.g. using GPS) and active pointing of the transmitting and receiving antenna (including on platform beam steering) may also be employed. One example of a planar antenna currently used on UAVs is the ultra-thin antenna marketed by Pharad LLC. In some embodiments similar antenna structures may be adapted for use in the multi-functional skins.

FIG. 1 shows an exemplary cross-section of a bi-facially operating, multi-function, multilayer film or skin with a PV layer and a RF antenna layer. It is shown as a multilayer article with a PV layer (101) which can generate electrical current when illuminated by incident light (102) through one face of the skin. The PV layer is electrically connected to an external circuit through a backplane (103) for distribution of electrical energy. The PV skin face may optionally include an outer layer or layers (104) for environmental protection, anti-reflection, or other desirable effects. The skin further comprises an antenna layer (105) which can receive or transmit RF signals (106) through the opposite face of the skin. The antenna layer is connected to an external circuit through a backplane (108) for the distribution of RF signals. The antenna face of the skin further comprises an optional outer layer, or layers (107) for environmental protection or other desired effect. The skin may also include optional inner layer (109) for isolation (e.g., electrical isolation) of the PV and RF elements and/or to facilitate structural integration. Alternatively, the backplanes 103 and 108 may be the same layer, with appropriate circuit patterning and isolation.

Figure 2:
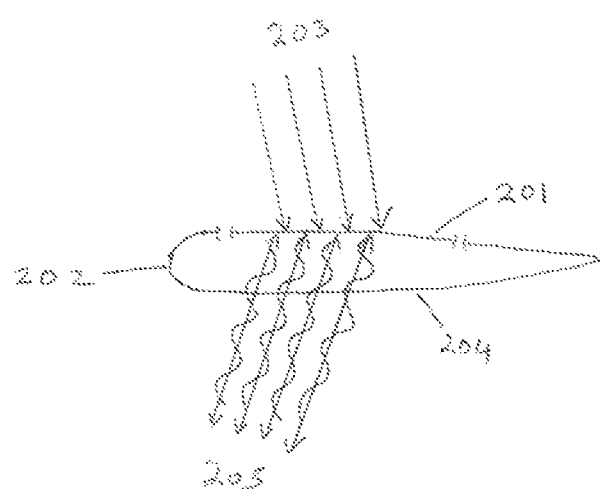
FIG. 2 shows an exemplary cross-section of a bi-facially operating, multi-functional multi-layered PV-Antenna skin deployed on the top surface of an aircraft wing.

FIG. 2 shows an exemplary cross section of a deployed bi-facially operating, multi-functional PV-antenna film or skin (201) on the top surface of a conventional aircraft wing (202). Incident electromagnetic radiation (203) can access the PV layer unobstructed, while incident, or transmitted, RF signals (205) passes through the lower surface (204) and internal volume of the wing, the materials and construction of which should be selected to permit adequate RF signal transmission. Of course, structures other than aircraft wings, including but not limited to other parts of an aircraft, may be used as the support or substrate on which the multifunctional, multilayer films or skins may be employed.

Figure 3:
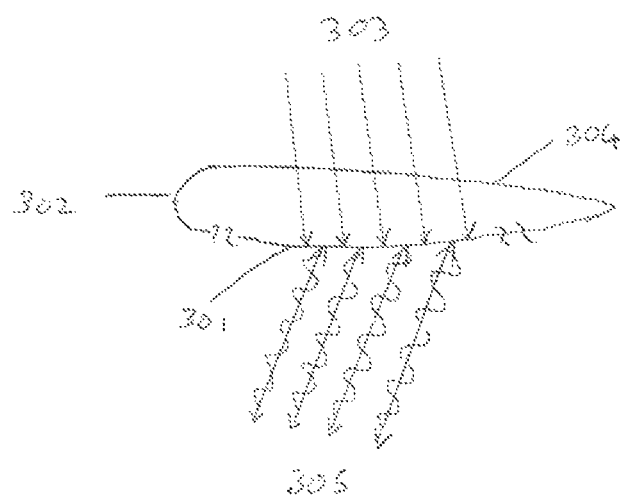
FIG. 3 shows an exemplary cross-section of a bi-facially operating, multi-functional, multi-layered PV-antenna skin deployed on the bottom surface of an aircraft wing.

FIG. 3 shows an exemplary cross section of a deployed bi-facially operating, multi-functional PV-antenna skin (301) on the bottom surface of a conventional aircraft wing (302). In this case the incident electromagnetic radiation (303) passes through the upper surface and internal volume of the wing, the materials and construction of which should be selected to permit adequate transmission of light. Incident, or transmitted, RF signals are unobstructed by the wing. Of course, as in other embodiments described herein, the film or skin 301 shown in FIG. 3 may be formed on structures other than aircrafts generally or aircraft wings in particular.

What is claimed is:

1. A multifunctional structure, comprising:
a self-supporting, open frame;
a multilayer skin or film extending over and secured to the self-supporting, open frame, the multilayer skin or film including:
a first layer that includes at least one photovoltaic (PV) cell, the first layer being disposed within the multilayer skin or film such that the first layer and the PV cell is exposable to electromagnetic radiation being received by a first surface of the film or skin, the at least one photovoltaic cell being configured to generate electrical power from the electromagnetic radiation; and
a second layer that includes at least one RF antenna, the second layer being disposed within the multilayer skin or film such that the second layer and the RF antenna is exposable to RF radiation received by a second surface of the film or skin, the first and second surface being opposing surfaces of the multilayer skin or film, wherein the PV cell receives the electromagnetic radiation from the first surface of the skin or film along a path through the skin or film that does not traverse the second layer.

2. The multifunctional structure of claim 1, wherein the multilayer skin or film further comprises at least one retaining, protective layer disposed over the first or second layer.

3. The multifunctional structure of claim 2, wherein the multilayer skin or film further comprises at least one other retaining, protective layer disposed over the other of the first and second layers.

4. The multifunctional structure of claim 1, wherein the at least one photovoltaic cell includes one or more PV cell arrays.

5. The multifunctional structure of claim 4, wherein the at least one RF antenna includes one or more RF antenna arrays.

6. The multifunctional structure of claim 5, wherein the multilayer skin or film further comprises at least one first electrical interconnection layer for electrically connecting RF antennas in the RF antenna array.

7. The multifunctional structure of claim 6, wherein the first electrical interconnection layer includes a patterned backplane.

8. The multifunctional structure of claim 6, wherein the first electrical interconnection layer also electrically connects solar cells in PV cell array.

9. The multifunctional structure of claim 1, wherein the PV cell includes one or more thin film photovoltaic absorber layers formed from a material selected from the group consisting of amorphous Silicon, Cadmium Telluride, Cu—In—Ga—Se and GaAs.

10. The multifunctional structure of claim 9, further comprising a flexible substrate, the one or PV cell arrays being disposed on the flexible substrate.

11. The multifunctional structure of claim 1, wherein the RF antenna is a planar antenna.

12. The multifunctional structure of claim 11, wherein the planar antenna is micro-strip antenna.

13. The multifunctional structure of claim 1, wherein the RF antenna is a meta-material antenna.

14. The multifunctional structure of claim 1, wherein the multilayer skin or film further comprises at least one anti-reflective layer for capturing the electromagnetic radiation to which the PV cell is exposed.

15. The anti-reflection layer of claim 14, wherein the anti-reflective layer is configured to transmit therethrough solar energy having optical wavelengths.

16. The anti-reflective layer of claim 14, wherein the anti-reflective film is configured to transmit therethrough electromagnetic radiation received at angles of incidence between 0-180 degrees.

17. The multifunctional structure of claim 5, wherein the RF antenna array is an actively steerable antenna.

18. The multi-functional structure of claim 1, further comprising an electrical interconnect electrically coupled to the PV cell for providing electrical power to an external element.

19. The multi-functional structure of claim 1, further comprising a self-powered, operationally mobile platform or device, the self-supporting open frame being located on an external portion of the operationally mobile platform or device.

20. The multi-functional structure of claim 1, wherein the self-supporting open frame constitutes at least a portion of an aircraft wing.

21. The multifunctional structure of claim 1, wherein the PV cell includes a plurality of solar cells operating at different wavelengths.

22. The multifunctional structure of claim 1, wherein the PV cell includes a multi-junction PV cell.

23. The multifunctional structure of claim 1, where the first layer includes at least one PV cell operational with electromagnetic energy other than solar energy.

24. The multifunctional structure of claim 1, wherein the second layer includes a plurality of RF antennas operational at different frequencies.

25. The multifunctional structure of claim 1, wherein the second layer includes an antenna configured to receive beamed microwave energy from a remote source and convert the microwave energy to electrical energy.

26. The multifunctional structure of claim 1, wherein the multi-functional skin is a continuous element.

27. The multifunctional structure of claim 1, wherein the multi-functional skin comprises a plurality of modular elements laterally disposed across the open-frame structure.

28. A multi-functional structure, comprising:
a self-supporting substrate;
a multilayer skin or film disposed on the substrate, the multilayer skin or film including:
a first layer that includes at least one photovoltaic (PV) cell, the first layer being disposed within the multilayer skin or film such that the first layer and the PV cell is exposable to electromagnetic radiation being received by a first surface of the film or skin, the at least one photovoltaic cell being configured to generate electrical power from the electromagnetic radiation; and
a second layer that includes at least one RF antenna, the second layer being disposed within the multilayer skin or film such that the second layer and the RF antenna is exposable to RF radiation received by a second surface of the film or skin, the first and second surface being opposing surfaces of the multilayer skin or film, the self-supporting substrate being transparent to at least one of electromagnetic radiation being received by the first surface or the RF radiation received by the second surface, wherein the PV cell receives the electromagnetic radiation from the first surface of the skin or film along a path through the skin or film that does not traverse the second layer.

* * * * *